United States Patent
Akram et al.

(10) Patent No.: US 6,627,999 B2
(45) Date of Patent: *Sep. 30, 2003

(54) FLIP-CHIP WITH MATCHED SIGNAL LINES, GROUND PLANE AND GROUND BUMPS ADJACENT SIGNAL BUMPS

(75) Inventors: Salman Akram, Boise, ID (US); John O. Jacobson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/037,637

(22) Filed: Oct. 23, 2001

(65) Prior Publication Data

US 2002/0113320 A1 Aug. 22, 2002

Related U.S. Application Data

(63) Continuation-in-part of application No. 09/653,139, filed on Aug. 31, 2000.

(51) Int. Cl.$^7$ .............................................. H01L 23/48
(52) U.S. Cl. ....................................... 257/778; 257/774
(58) Field of Search ................................ 257/778, 691, 257/668, 723, 666; 357/74, 80; 361/760

(56) References Cited

U.S. PATENT DOCUMENTS

| | | | |
|---|---|---|---|
| 4,183,041 A | | 1/1980 | Goel |
| 4,551,746 A | * | 11/1985 | Gilbert et al. ................. 357/74 |
| 4,626,889 A | | 12/1986 | Yamamoto et al. |
| 4,833,521 A | | 5/1989 | Early |
| 5,089,881 A | * | 2/1992 | Panicker ....................... 357/80 |
| 5,221,858 A | | 6/1993 | Higgins, III |
| 5,245,214 A | | 9/1993 | Simpson |
| 5,399,902 A | | 3/1995 | Bickford et al. |
| 5,422,513 A | * | 6/1995 | Marcinkiewicz et al. ... 257/668 |
| 5,482,898 A | | 1/1996 | Marrs |
| 5,623,628 A | | 4/1997 | Brayton et al. |
| 5,629,241 A | | 5/1997 | Matloubian et al. |
| 5,696,466 A | | 12/1997 | Li |
| 5,717,245 A | * | 2/1998 | Pedder ......................... 257/691 |
| 5,751,554 A | | 5/1998 | Williams et al. |
| 5,757,074 A | | 5/1998 | Matloubian et al. |
| 5,877,552 A | | 3/1999 | Chiang |
| 5,898,217 A | * | 4/1999 | Johnston ...................... 257/691 |
| 5,945,886 A | | 8/1999 | Millar |
| 5,950,304 A | | 9/1999 | Khandros et al. |
| 5,977,617 A | * | 11/1999 | Kata ............................ 257/668 |
| 5,983,089 A | | 11/1999 | Mohwinkel et al. |
| 6,018,196 A | | 1/2000 | Noddin |
| 6,020,220 A | | 2/2000 | Gilleo et al. |
| 6,020,637 A | | 2/2000 | Karnezos |
| 6,037,822 A | | 3/2000 | Rao et al. |
| 6,048,753 A | | 4/2000 | Farnworth et al. |
| 6,054,758 A | * | 4/2000 | Lamson ....................... 257/691 |
| 6,114,751 A | | 9/2000 | Kumakura et al. |
| 6,121,815 A | | 9/2000 | Terada et al. |
| 6,346,743 B1 | * | 2/2002 | Figueroa et al. ............. 257/723 |
| 6,377,464 B1 | * | 4/2002 | Hashemi et al. ............. 361/760 |
| 6,380,616 B1 | | 4/2002 | Tutsch et al. |
| 6,462,423 B1 | * | 10/2002 | Akram et al. ................ 257/778 |

* cited by examiner

*Primary Examiner*—David Nelms
*Assistant Examiner*—Thinh Nguyen
(74) *Attorney, Agent, or Firm*—TraskBritt

(57) ABSTRACT

A method and apparatus for substantially reducing the need for capacitive and inductive compensation for signal lines on a flip-chip semiconductor device. A flip-chip semiconductor device is disclosed having signal lines of substantially equal lengths. At least one ground plane is also disposed on the flip-chip semiconductor device and separated from the signal lines by a dielectric layer. By using a ground plane and signal lines having substantially equal lengths, impedance caused by electromagnetic and electrostatic coupling is significantly reduced, and impedance from signal line length is balanced such that the loads on each of the signal lines, as viewed by the semiconductor die, are substantially equal. In another embodiment, the flip-chip semiconductor device includes both signal bumps extending from the signal lines and ground bumps extending from the ground plane, wherein the ground bumps are arranged adjacent the signal bumps.

43 Claims, 13 Drawing Sheets

FLIP-CHIP WITH MATCHED SIGNAL LINES, GROUND PLANE AND GROUND BUMPS ADJACENT SIGNAL BUMPS

CROSS-REFERENCE TO RELATED APPLICATION

This application is a continuation-in-part of application Ser. No. 09/653,139, filed August 31, 2000, pending.

BACKGROUND OF THE INVENTION

Field of the Invention: The present invention relates generally to reducing coupling between adjacent signal lines and signal bumps and compensation for impedance, capacitance and inductance through matching conductive line lengths for a flip-chip type semiconductor device. Particularly, the invention includes ground bumps extending from at least one ground plane that are adjacent the signal bumps to reduce coupling between adjacent signal bumps and signal lines having matched lengths to simplify compensation circuitry.

State of the Art: Interconnection and packaging-related issues are among the factors that determine not only the number of circuits that can be integrated on a chip but also the performance of the chip. These issues have gained in importance as advances in chip design have led to reduced sizes of transistors and enlarged chip dimensions. The industry has come to realize that merely having a fast chip will not necessarily result in a fast system; the fast chip must also be supported by equally fast and reliable connections. Essentially, the connections, in conjunction with the packaging, supply the chip with signals and power and redistribute the tightly packed terminals of the chip to the terminals of a carrier substrate such as a printed wiring board.

FIGS. 1 and 2 illustrate a prior art flip-chip semiconductor device 2 in conjunction with a carrier substrate 4. Flip-chip technology, including its fabrication and use, is well known to those of ordinary skill in the art as this technology has been in use and developed for over 30 years. As shown in FIG. 1, a flip-chip semiconductor device 2 conventionally comprises an active semiconductor die 6 having an active surface 8 and active surface contacts or bond pads 10. A dielectric layer 12, for example, of silicon dioxide or silicon nitride, is formed over the active surface 8 by techniques well known in the art. Vias 14 are defined in dielectric layer 12, for example, using well-known photolithographic techniques to mask and pattern the dielectric layer 12 and etch same, for example, with buffered HF to expose the contacts or bond pads 10 of the active surface 8. The bond pads 10 may be connected to traces of an electrical interconnect layer 16 on the dielectric layer 12 in the form of power, ground and signal lines 17 in a well-known manner, for example, by evaporating or sputtering aluminum or an alloy thereof, followed by masking and etching. The power, ground and signal lines 17 of the electrical interconnect layer 16 enable the relatively compact array of bond pads 10 to be distributed over a broader surface area. Solder bumps 18, or balls, are placed upon ends of the signal lines 17 of the electrical interconnect layer 16 to enable electrical coupling with contact pads 20 on the carrier substrate 4, such as a printed wiring board. The flip-chip semiconductor device 2, with the solder bumps 18, is inverted so that its front surface 24 faces toward the top surface 26 of the carrier substrate 4, with each solder bump 18 on the flip-chip semiconductor device 2 being positioned on the appropriate contact pad 20 of the carrier substrate 4. The assembly of the flip-chip semiconductor device 2 and the carrier substrate 4 is then heated so as to liquify the solder bumps 18 and thus connect each bond pad 10 on the flip-chip semiconductor device 2 to an associated contact pad 20 on the carrier substrate 4.

Because the flip-chip type arrangement does not require leads coupled to the active surface of a semiconductor die and extending beyond the lateral periphery thereof, it provides a compact assembly in terms of the die's "footprint." In other words, the area of the carrier substrate 4 occupied by the contact pads 20 is, for a given size semiconductor die, the same or less than that occupied by the die itself. Furthermore, the contacts on the semiconductor die, in the form of solder bumps 18, may be arranged in a so-called "area array" disposed over substantially the entire active surface or front face of the die. Flip-chip type mounting techniques, therefore, are well suited for use with semiconductor dice having large numbers of bond pads, in contrast to wire bonding type and tape-automated type mounting techniques which are far more limiting in terms of the number of bond pads which may reasonably and reliably be employed. As a result of the use of flip-chip type mounting techniques, the maximum number of I/O and power/ground terminals available for the semiconductor die can be increased, and signal and power/ground interconnections can be more efficiently routed on the die. Examples of methods of fabricating semiconductor die assemblies using flip-chip type and other type techniques are described in U.S. Pat. No. 6,048,753 to Farnworth et al. (Apr. 11, 2000), U.S. Pat. No. 6,018,196 to Noddin (Jan. 25, 2000), U.S. Pat. No. 6,020,220 to Gilleo et al. (Feb. 1, 2000), U.S. Pat. No. 5,950,304 to Khandros et al. (Sep. 14, 1999), and U.S. Pat. No. 4,833,521 to Early (May 23, 1989).

As with any conductive line carrying a signal, signal lines for integrated circuits generate electromagnetic and electrostatic fields. These electromagnetic and electrostatic fields may affect the signals carried in adjacent signal lines unless some form of compensation is used. It is known to use a ground plane to couple the cross-talk from a signal line in a semiconductor assembly.

An example of a semiconductor assembly having a ground plane is illustrated and described in U.S. Pat. No. 6,020,637 to Karnezos (Feb. 1, 2000), the disclosure of which is hereby incorporated herein by reference. The Karnezos reference discloses an interconnect substrate having an aperture therein which is attached to a heat spreader. A ground plane is provided on the interconnect substrate and a chip is back bonded to the heat spreader in the aperture of the interconnect substrate. Signal bumps and ground bumps are formed on the interconnect substrate, the signal bumps interconnecting with traces and bond wires to the chip and the ground bumps interconnecting with the ground plane. However, in some instances, the interconnect substrate in the Karnezos reference is large and not conducive to limiting the "real estate" required for a particular chip due to the wire bond assembly thereof. While in additional instances, the adjacent signal bumps and signal lines are likely to produce electromagnetic and electrostatic coupling therebetween. Furthermore, none of the ground panes are formed directly on the chip.

Electromagnetic and electrostatic coupling between signal lines, or "cross-talk", is undesirable because it increases the load of the signal lines and may create noise and signal delays. The primary factors affecting cross-talk include the surface area of the signal line directed to an adjacent signal line, which includes signal line length, the distance between the signal lines and the dielectric constant ($\epsilon_r$) of the material between the signal lines. For flip-chip type semiconductor devices, where a large number of contacts with attached signal lines are used to carry signals to various locations for convenient access, impedance changes and cross-talk can be a significant factor affecting the speed and signal integrity of the device and system in which it is connected.

One further aspect of flip-chip type semiconductor device packaging which adds to the complexity of matching the loads and delays and, therefore, the signal integrity of the lines is the varying external line lengths between bond pads or other contacts on a semiconductor die and the connections of the substrate on which the die is mounted. To achieve a faster system and therefore shortest delay in a semiconductor device environment, conventional wisdom encourages the shortest signal line possible because the shorter the distance the signal needs to travel, the faster it arrives. As a result, when a signal line path is designed for placement on a semiconductor die, or other carrier substrate, it is typically designed with each signal line having an optimal path such that it travels on as short a path as possible, given the overall layout of all the signal line paths. In other words, the signal lines travel in as direct a path as possible from their origins to their destinations, with some variance to accommodate for the paths of other signal lines and positions of various components. For a given semiconductor die architecture matched to a given I/O array architecture for a specific application, existing signal line lengths are, therefore, varied. Because the load of the signal line is, in part, dependent upon the length of the signal line, the loads of the signal lines of varied length will, therefore, also be varied. Furthermore, due to varied signal line lengths, signals traveling on those signal lines of different lengths have varied travel times and associated delays.

When the loads and delays on multiple signal lines fed by a common die are equal, the signal strength of the overall system is strongest and signal transfer is most reliable. Mismatches of characteristic impedance between the signal lines may cause undesirable signal reflections and delays. It is most desirable to have equal impedance loads or a constant characteristic impedance on each signal line associated with a semiconductor die, as viewed from the die. To accomplish this, a method used with flip-chip type and other type packaging is to add inductors and capacitors to balance the load on each signal line as seen by the semiconductor die. Adding inductors and capacitors, however, while helpful in balancing mismatched loads, is a difficult way to match loads precisely to a given system in all environments, is relatively more expensive than without such capacitors and inductors, and undesirably increases the power consumed and heat produced by the system.

Therefore, it is desirable to have a flip-chip type packaged semiconductor device having matched characteristic loads on its respective signal lines, as viewed by the semiconductor die, without the heat-producing and power-consuming capacitors and inductors used previously. Further, it is also desirable to have a flip-chip type semiconductor device that prevents or reduces electromagnetic and electrostatic coupling between adjacent signal lines and interconnections.

BRIEF SUMMARY OF THE INVENTION

The present invention provides a relatively inexpensive alternative to the inductors and capacitors conventionally used to match impedance for flip-chip type signal lines for semiconductor devices. According to the present invention, each signal line on a flip-chip type semiconductor device has substantially a common length, regardless of the signal line's origin and destination on the device. By adding bends and direction changes into the conventional paths of signal lines on a flip-chip type device, the overall length of each of the signal lines may be made substantially equal. Additionally, a ground plane may be placed above or below a signal line layer, or both above and below it, separated from the signal line layer by a dielectric layer. By placing a ground plane near the signal line layer, the signal lines are isolated from the active surface of the semiconductor die or the signal lines on a circuit board, or both, and a reference is created for matching impedance. Further, a ball grid array on the flip-chip type device may be configured to have both ground bumps and signal bumps arranged in a manner to further isolate electromagnetic and electrostatic coupling between adjacent signal bumps. The ground plane further allows signals on the various signal lines to have a return path to the source. By the signal lines each having a common electrical length, they also have a common capacitance, inductance and impedance, common time required for signal propagation, and other common characteristics and thus do not require compensation using inductors and capacitors.

A method of manufacturing flip-chip type semiconductor devices is disclosed wherein a first dielectric passivation layer is deposited on a surface of a semiconductor die having bond pads, and portions of the first passivation layer are removed to expose the bond pads. A conductive layer is deposited over the first dielectric passivation layer, and portions of the conductive layer are removed to define ground, power or signal lines, or traces, extending in substantially common lengths to locations for conductive elements. A second dielectric passivation layer is deposited over the conductive signal lines, and portions of the second passivation layer are removed to allow access to the conductive signal lines at the conductive element locations. A ground plane is deposited over portions of the second passivation layer, leaving the conductive element locations exposed and surrounded by a border of dielectric material. A dielectric layer is deposited over portions of the ground plane to insulate the ground plane from the conductive elements which are coupled to the conductive signal lines at the conductive element locations. Alternatively or additionally, a ground plane may be deposited before the conductive signal line layer and separated from it by an additional dielectric passivation layer and borders of dielectric material through which conductive elements may extend from the semiconductor die surface to the conductive element locations. In an alternative embodiment, ground conductive elements are coupled to the ground plane and are positioned substantially adjacently planar with the conductive elements coupled to the signal lines.

An electronic system is disclosed comprising a processor, a memory device, an input, an output and a storage device, at least one of which includes a flip-chip type semiconductor device having signal lines, each of a substantially common length. A semiconductor wafer is disclosed having at least one flip-chip type semiconductor device having signal lines, each of a substantially common length.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to several drawings herein, wherein:

DETAILED DESCRIPTION OF THE INVENTION

To ensure that each of the signal lines of a flip-chip type semiconductor device have matched loads as seen by the semiconductor die, the present invention includes a ground plane and signal lines, each having a substantially equal signal line length. By creating a semiconductor device having signal lines of substantially equal lengths, there is no need to additionally compensate for the varied loads of the signal lines using inductors and capacitors. A system without compensating inductors and capacitors produces less heat and has a reduced overall power consumption.

Figure 3:
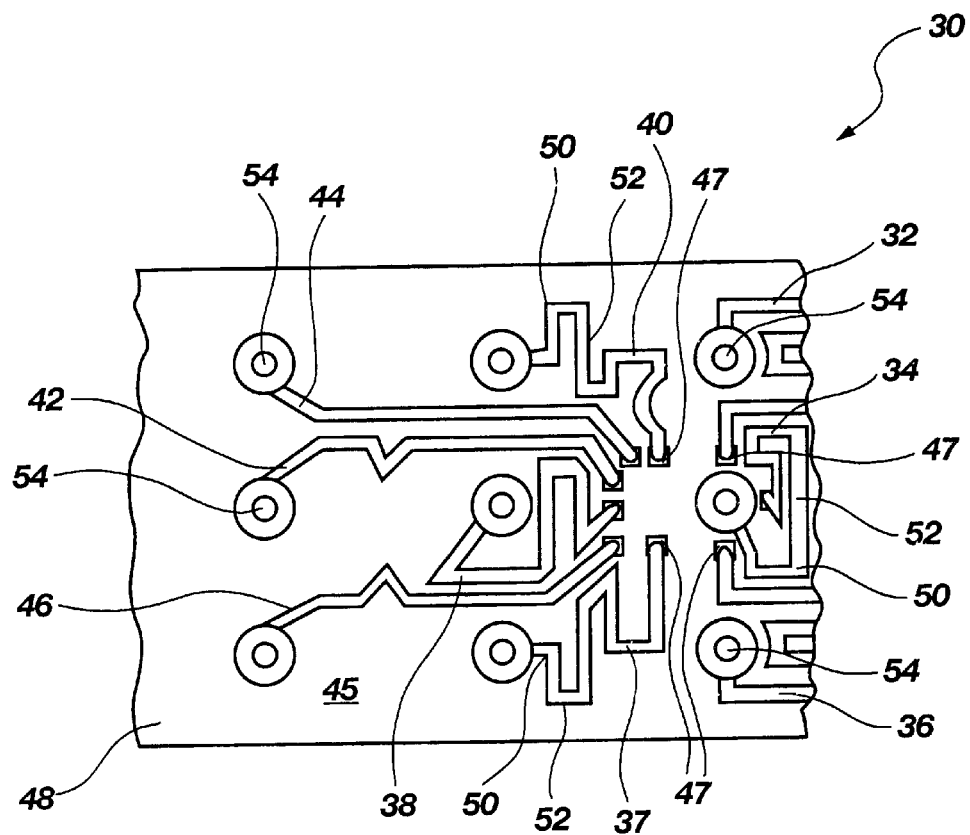
FIG. 3 is an active surface view of a flip-chip semiconductor device according to a first embodiment of the present invention.

Illustrated in drawing FIG. 3 is a view of an active surface of a portion of a flip-chip type semiconductor device 30 having signal lines 32, 34, 36, 37, 38, 40, 42, 44 and 46 of substantially equal lengths. According to a first embodiment of the present invention, the signal lines 32, 34, 36, 37, 38, 40, 42 and 46, which would conventionally be shorter due to their positions in relation to respective bond pads 47 on the active surface 45 of the semiconductor die 48, each have additional direction changes 50 and line lengths 52 added to extend their overall line length to be substantially equal to that of the longest signal line 44. In this way, and because each of the signal lines 32, 34, 36, 37, 38, 40, 42, 44 and 46 is conventionally formed of the same conductive material having the same properties and the same width and height, the electrical signals carried by the signal lines 32, 34, 36, 37, 38, 40, 42, 44 and 46 must each travel the same distance through the same conductive medium between the bond pads 47 and the conductive elements 54. Thus, the load "seen" by the semiconductor die 48 on each signal line 32, 34, 36, 37, 38, 40, 42, 44 and 46 is substantially the same. Additionally, signal delays and clock skew caused by varied signal line lengths is avoided.

Because signal lines are conventionally formed by selectively removing conductive material from a conductive layer using well-known photolithographic techniques and etching, adding additional direction changes 50 and lengths 52 to the signal lines 32, 34, 36, 37, 38, 40, 42, 44 and 46 will not add additional expense or steps to the semiconductor fabrication process of the semiconductor die 48, as the mask pattern used to define the signal lines in a layer of conductive material deposited over the active surface of the die may easily be configured to provide the substantially equal signal line lengths.

Figure 4:
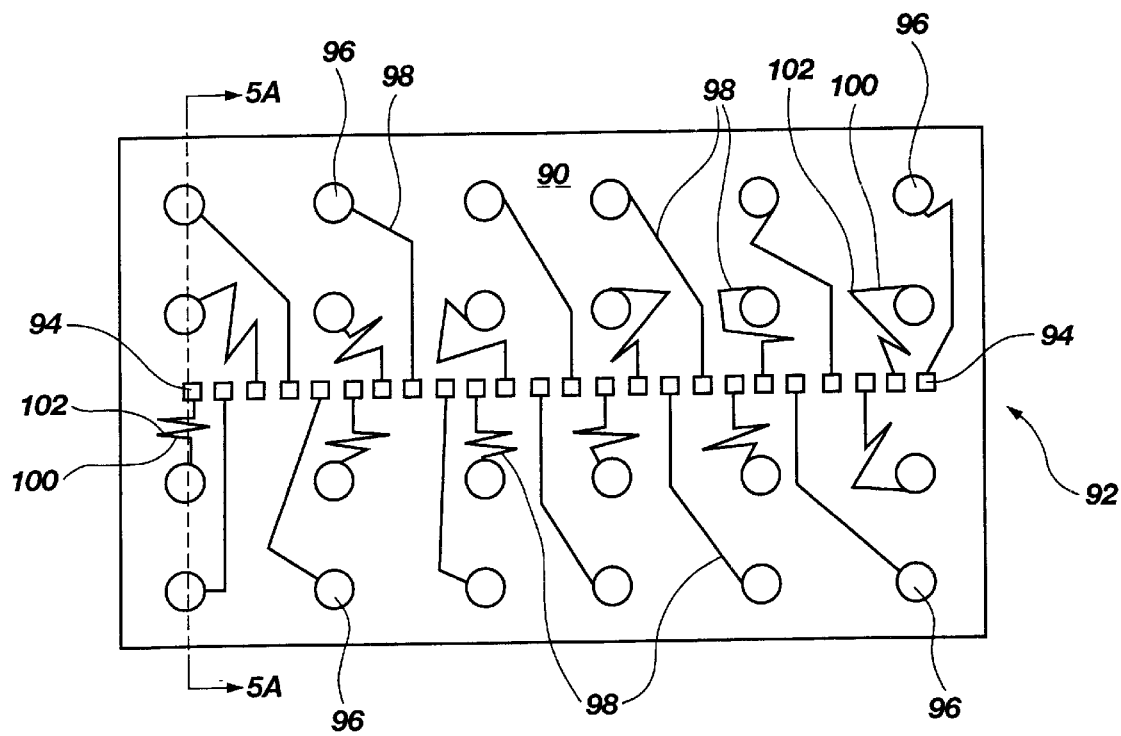
FIG. 4 is an active surface view of a flip-chip semiconductor device according to a first alternate of the first embodiment of the present invention.

Illustrated in drawing FIG. 4 is a first alternative of the first embodiment of the present invention. FIG. 4 shows a first array of connections to the active surface 90 of a semiconductor die 92 in the form of bond pads 94 in a single row located in substantially the center of the active surface 90 of semiconductor die 92 although the row may be located at any position on the active surface 90. A second array of connections, in the form of conductive elements 96, is distributed over the active surface 90 of the semiconductor die 92. Most preferably, the conductive elements 96 are distributed substantially uniformly over the active surface 90 of the semiconductor die 92 to maximize the pitch of, or spacing between, the conductive elements 96. However, any arrangement of conductive elements 96 is acceptable for use with the present invention. Each bond pad 94 is coupled to a conductive element 96 through a signal line 98 comprising a substantially equal length. To achieve substantially equal lengths for all signal lines, as with the first embodiment of the present invention shown in FIG. 3, additional line lengths 100 and direction changes 102 are added to a portion of each of the plurality of signal lines 98. For simplicity, signal lines 98 have been shown schematically in FIG. 4 as mere lines, rather than as wider conductive traces as depicted with respect to the signal lines of FIG. 3. Those of ordinary skill in the art will, however, understand and appreciate that formation of signal lines on semiconductor devices is a well-known technology and that selecting a suitable width for same is conventional.

Figure 5:
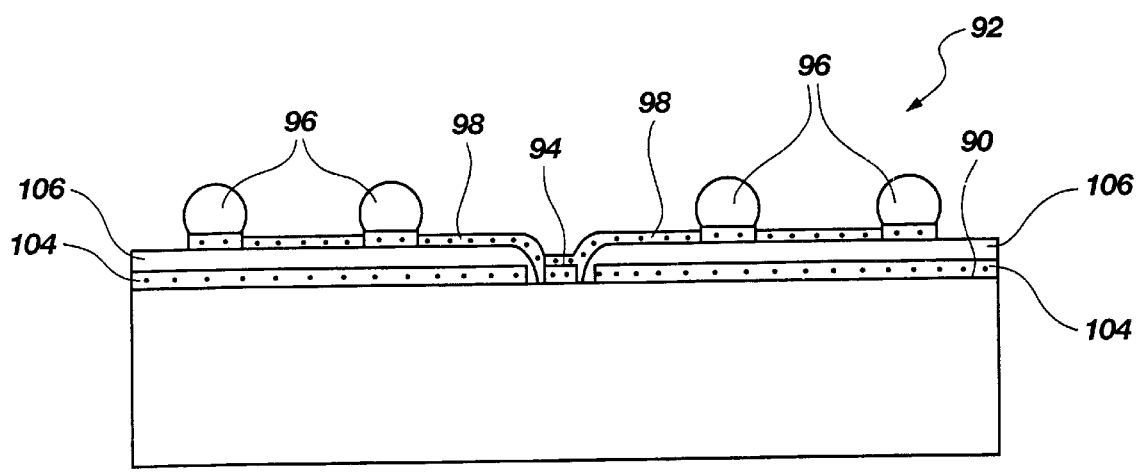
FIG. 5 is a cross-sectional view of the flip-chip semiconductor device of FIG. 4 sectioned along line 5A—5A.

Illustrated in drawing FIG. 5 is a cross-sectional view of the semiconductor die 92 of FIG. 4 along line 5A—5A. Also shown in FIG. 5 is a ground plane 104 and a dielectric passivation layer 106 disposed between the surface active 90 of the semiconductor die 92 and the signal lines 98.

Figure 6:
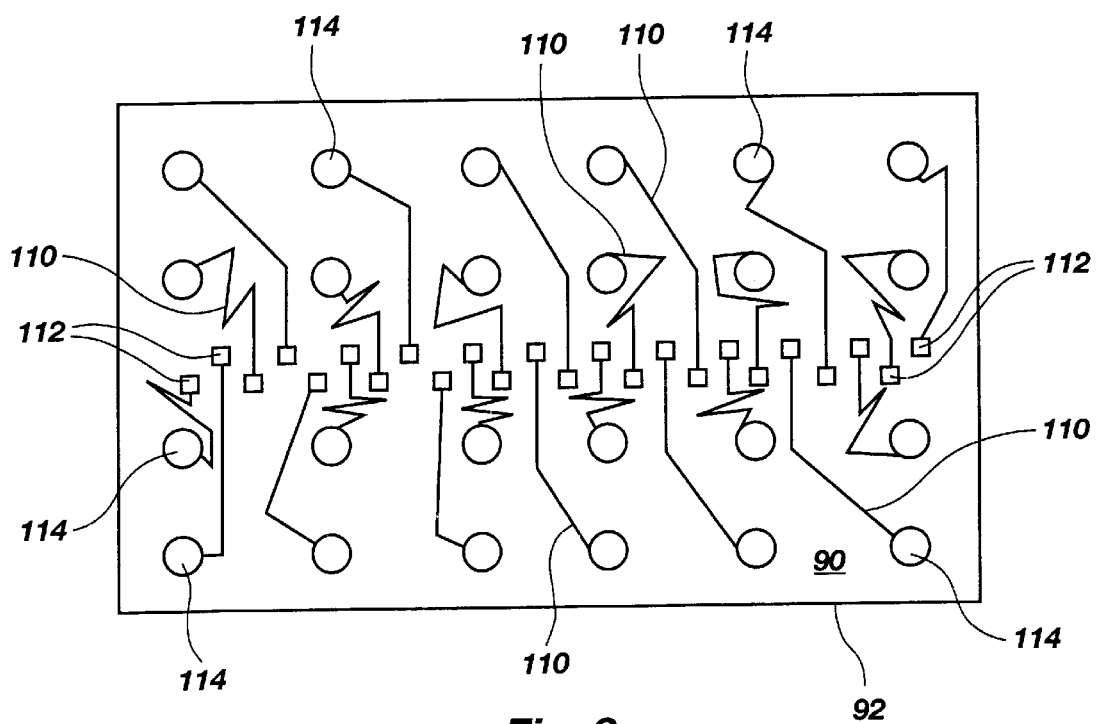
FIG. 6 is an active surface view of a flip-chip semiconductor device according to a second alternative of the first embodiment of the present invention.

Illustrated in drawing FIG. 6 is a second alternative of the first embodiment of the present invention. Though the lengths of signal lines 110 are all substantially equal between the bond pads 112 and the conductive elements 114, as with previous embodiments, the bond pads 112 are in two rows rather than one on the active surface 90 of a semiconductor die 92. Again, for simplicity, signal lines 110 have been shown schematically in FIG. 6 as mere lines, rather than as wider conductive traces as depicted with respect to the signal lines of FIG. 3. Those of ordinary skill in the art will, however, understand and appreciate that formation of signal lines on various types of semiconductor devices is a well-known technology and that selecting a suitable width for same is conventional.

Figure 7:
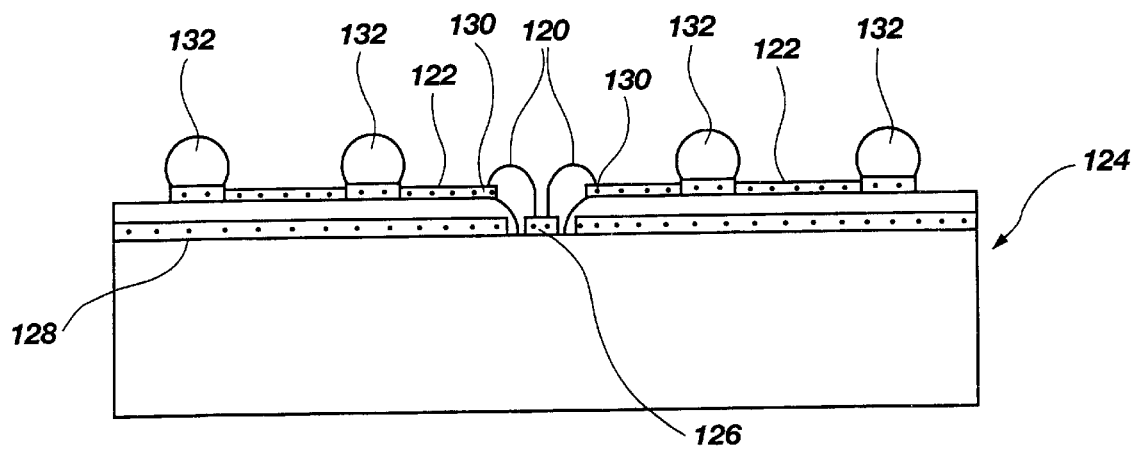
FIG. 7 is a cross-sectional view of a flip-chip semiconductor device according to the second alternative of the first embodiment of the present invention.

Illustrated in drawing FIG. 7 is the second alternative of the first embodiment of the present invention. In the embodiment shown in FIG. 7, the signal line lengths include a portion of bond wire 120 as a connection between traces 122 placed on the semiconductor die 124 and bond pads 126 coupled to the active surface 128 of the semiconductor die 124. The bond wires 120 may be bonded directly to the traces 122, or additional bond pads may be placed at the ends 130 of the traces 122 to facilitate bonding. Furthermore, the traces 122 and solder balls 132 may alternatively be formed on a carrier substrate separate from the semiconductor die 124 and the carrier substrate be placed over the semiconductor die active surface 128 and adhered thereto. By configuring the traces 122 to have substantially equal lengths between the solder balls 132 and the trace ends 130, the advantages of the invention may be realized. Additionally, the bond wires 120 are most preferably of substantially equal lengths. The embodiment of the present invention shown in FIG. 7 is particularly useful for adapting leads over chip (LOC) semiconductor die architectures for use with ball grid arrays (BGAs).

Figure 1:
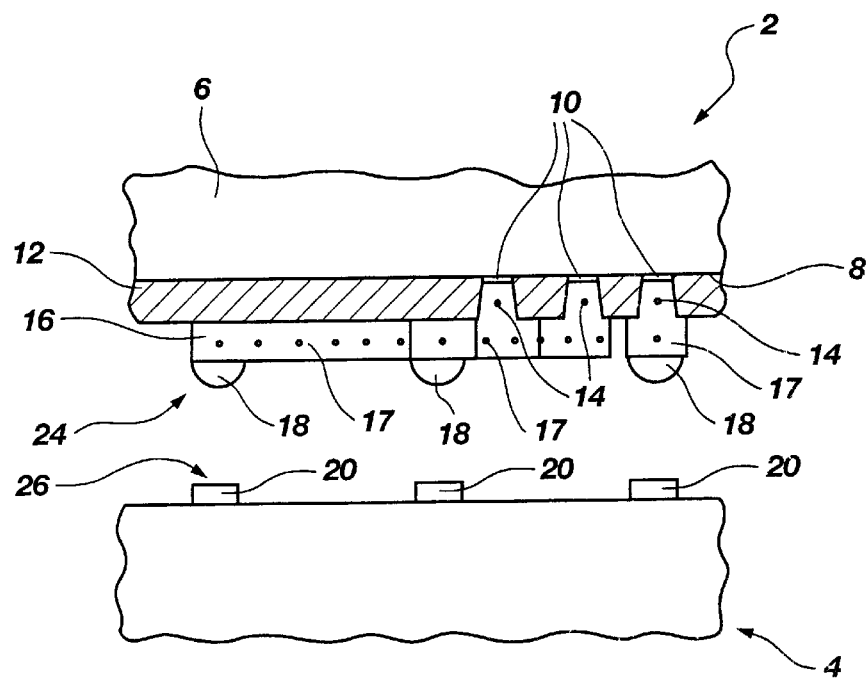
FIG. 1 is an active surface view of a prior art flip-chip semiconductor device.
Figure 2:
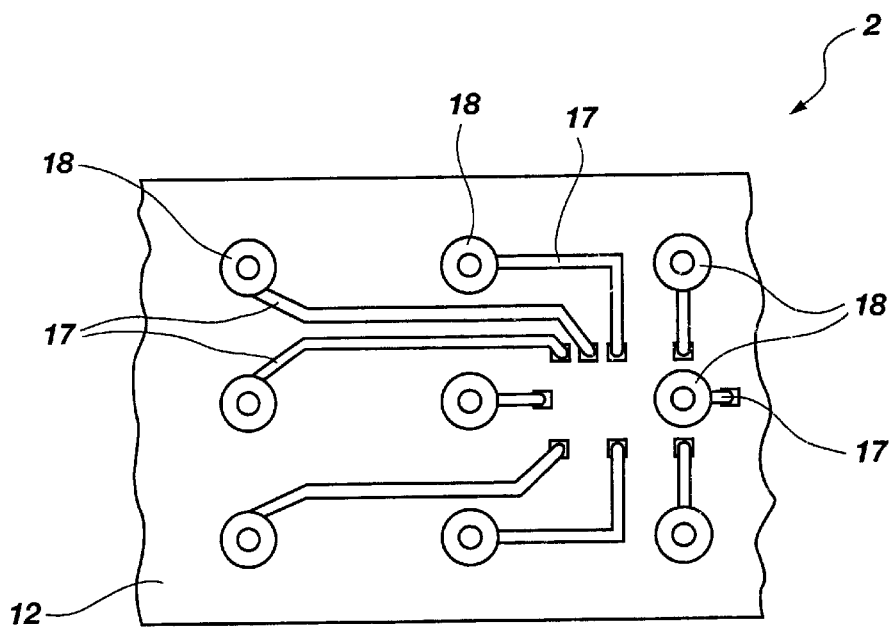
FIG. 2 is a cross-sectional view of a prior art flip-chip semiconductor device and carrier substrate.
Figure 8:
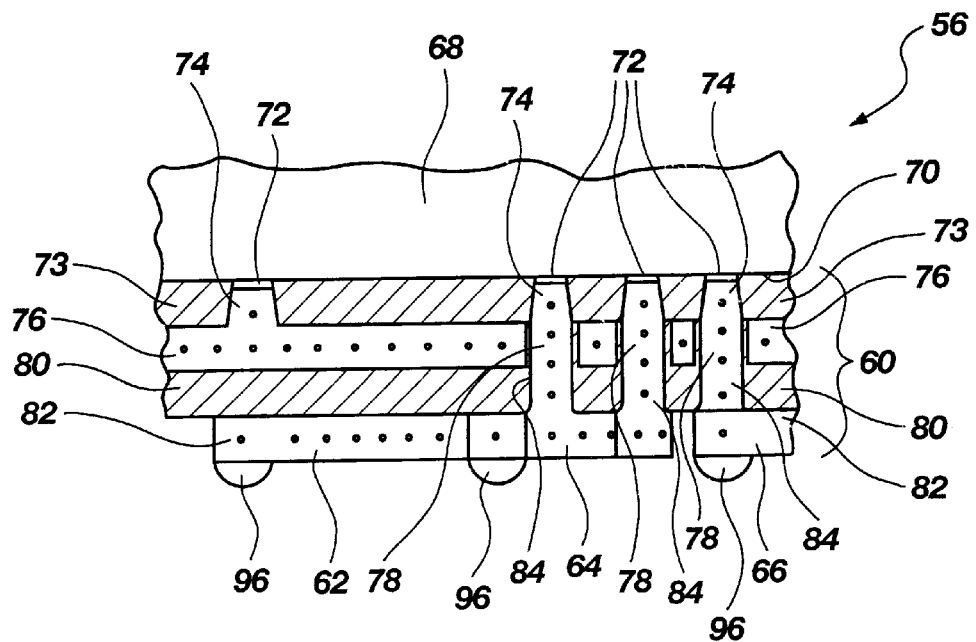
FIG. 8 is a cross-sectional view of a flip-chip semiconductor device according to a first embodiment of the present invention.

Illustrated in drawing FIG. 8 is a cross-sectional view of a flip-chip semiconductor device 56, such as that shown in FIG. 3, having at least one ground plane 76 according to a first embodiment of a second aspect of the present invention. The ground plane 76 is included among the flip-chip semiconductor device layers 60 to provide a reference basis for matching impedance and isolate each of the signal lines 62, 64 and 66 from the electromagnetic and electrostatic fields emanating from adjacent signal lines and circuitry. A semiconductor die 68 having an active surface 70 and active surface contacts in the form of bond pads 72 is provided. A first dielectric layer 73 is formed over the active surface 70 of the semiconductor die 68 and patterned to expose the bond pads 72 through openings or vias 74. A ground plane 76 is then formed on the first dielectric layer 73 in a well-known manner, such as by sputtering or evaporation of aluminum or aluminum alloy, and coupled to the bond pads 72 through the vias 74. Selected portions of the ground plane 76 are then defined, for example, using well-known photolithographic techniques and etched to form vias 78. This etching is performed, for example, using a solution consisting of nitric and phosphoric acids.

A second dielectric layer 80 is then formed, for example, by low-pressure chemical vapor deposition or spin-on polymer passivation, as well known to those of ordinary skill in the semiconductor art. It is important to note that the second dielectric layer 80 is formed not only on the upper surface of the ground plane 76, but also on the surface of the ground plane 76 located within the vias 78, thus preventing electrical connection between the ground plane 76 and the to-be-formed electrical interconnect layer 82. Vias 84 are then defined using methods well known in the art, such as well-known photolithographic techniques and etching, to expose selected bond pads 72 on the active surface 70 of the semiconductor die 68 which are to be connected to the electrical interconnect layer 82. The electrical interconnect layer 82 is then formed having signal lines 62, 64, and 66 of substantially equal lengths in a well-known manner, for example, by evaporating or sputtering aluminum or an aluminum alloy. Conductive elements 96 are placed upon portions of the electrical interconnect layer 82. The signal lines 62, 64, and 66 have substantially equal lengths by adding bends and lengths to make each of the signal lines 62, 64, and 66 substantially as long as the longest signal line.

By placing a ground plane 76 between the active surface 70 of the semiconductor die 68 and the electrical interconnect layer 82, the signal lines 62, 64, and 66 are isolated from the circuitry on the active surface 70. By placing the ground plane 76 sufficiently close to the electrical interconnect layer 82, the signal lines 62, 64, and 66 are isolated from each other. How close the ground plane 76 must be to the signal lines 62, 64, and 66 to sufficiently couple the electromagnetic and electrostatic fields from the signal lines 62, 64, and 66 to prevent cross-talk is dependent upon a number of factors including, for example, the height of the signal lines, the distance between the signal lines, material from which the signal lines are formed and the material between the signal lines. It is believed that one of ordinary skill in the art may readily determine the spacing required between the ground plane 76 and the electrical interconnect layer 82 to adequately couple the electromagnetic and electrostatic fields from the signal lines 62, 64, and 66 for a given application and architecture.

Figure 9:
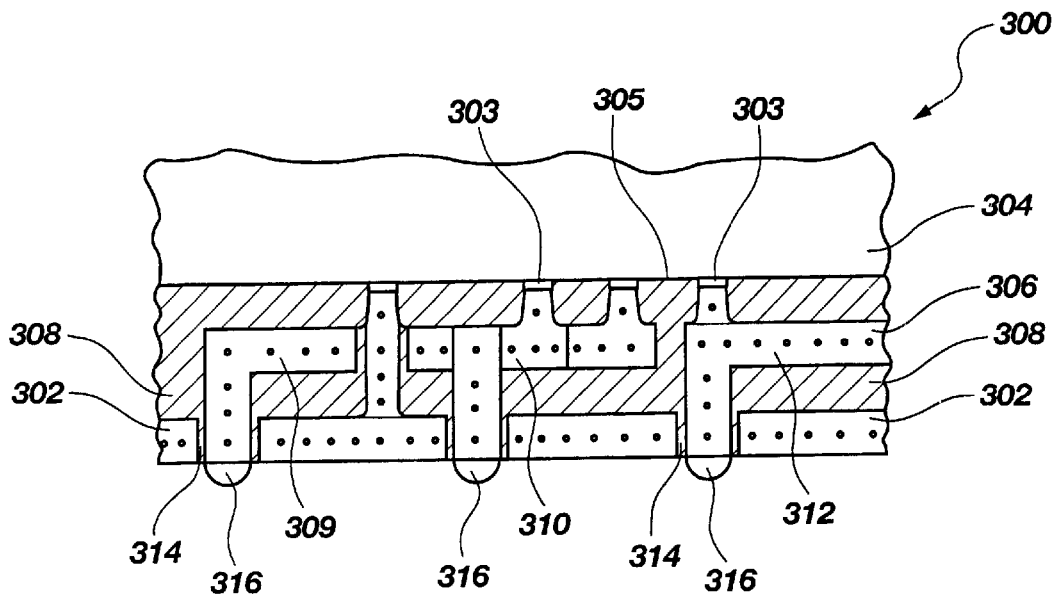
FIG. 9 is a cross-sectional view of a flip-chip semiconductor device according to a second embodiment of the present invention.

Illustrated in drawing FIG. 9 is a cross-sectional view of a portion of a flip-chip type semiconductor device 300 having at least one ground plane 302 according to a second embodiment of the present invention. The at least one ground plane 302 of the flip-chip type semiconductor device 300 of the second embodiment, rather than being placed between the semiconductor die 304 and the electrical interconnect layer 306, is placed above the electrical interconnect layer 306, separated therefrom by a dielectric layer 308. By placing the at least one ground plane 302 above the electrical interconnect layer 306, the at least one ground plane 302 isolates the signal lines 309, 310 and 312 connected to bond pads 303 on the active surface 305 of semiconductor die 304, each of a substantially equal length, from circuitry on a substrate such as a printed wiring board to be coupled to the flip-chip type semiconductor device 300. The fabrication techniques and methods for placing a ground plane 302 above the electrical interconnect layer 306 are similar to the techniques and methods for placing the ground plane 302 below the electrical interconnect layer 306 and are known to one of ordinary skill in the semiconductor art. It will also be clear to one of ordinary skill in the art that a dielectric or passivation material 314 must also be placed between the ground plane 302 and the conductive elements 316 to electrically isolate the conductive signals traveling through the conductive elements 316 to the electrical interconnect layer 306 from the ground plane 302.

Figure 10:
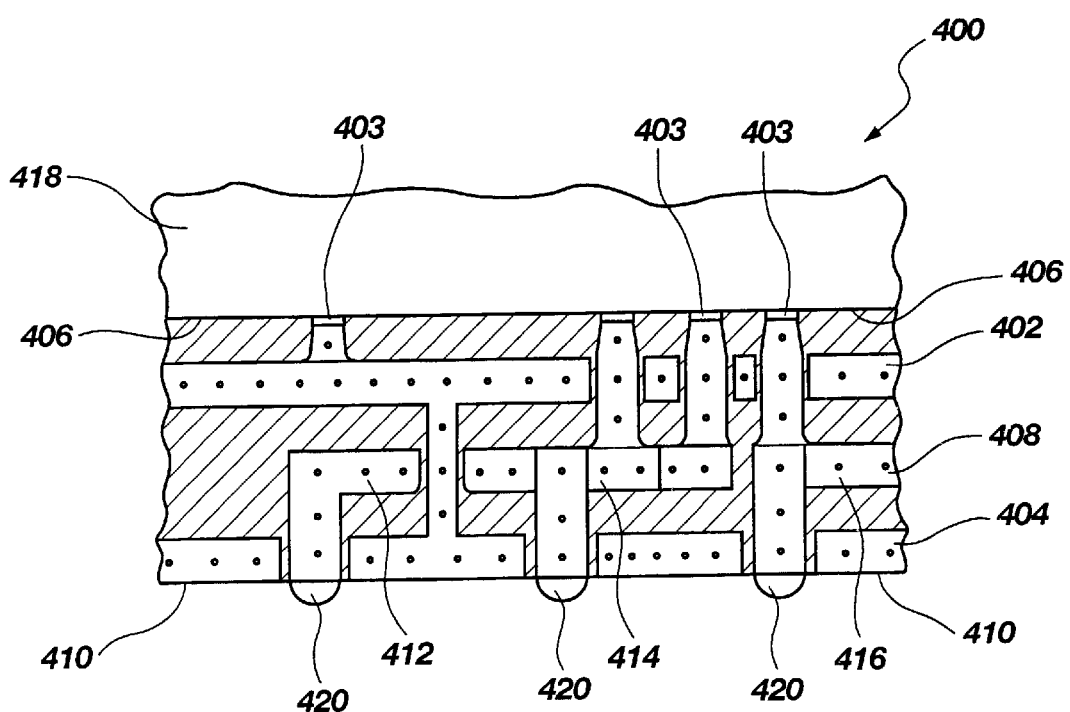
FIG. 10 is a cross-sectional view of a flip-chip semiconductor device according to a first alternative of the second embodiment of the present invention.

Illustrated in drawing FIG. 10 is a cross-sectional view of a portion of a flip-chip semiconductor device 400 having at least two ground planes 402 and 404 according to a first alternative of a second embodiment of the present invention. This alternative of the present invention combines the first and second embodiments in that there are two ground planes 402 and 404. By placing a ground plane 402 between the active surface 406 of the semiconductor die 418 and the electrical interconnect layer 408, and a ground plane 404 between the electrical interconnect layer 408 and the outer surface 410 of the flip-chip semiconductor device 400, the electrical interconnect layer 408 and corresponding signal lines 412, 414 and 416 connected to bond pads 403 on active surface 406 of semiconductor die 418, each of a substantially equal length, are isolated from both the active circuitry on the semiconductor die 418 and from any circuitry on a substrate such as a printed wiring board to be coupled to the flip-chip type semiconductor device 400 through conductive elements 420. One of ordinary skill in the art will understand how to combine the first and second embodiments to fabricate the present embodiment.

Figure 11:
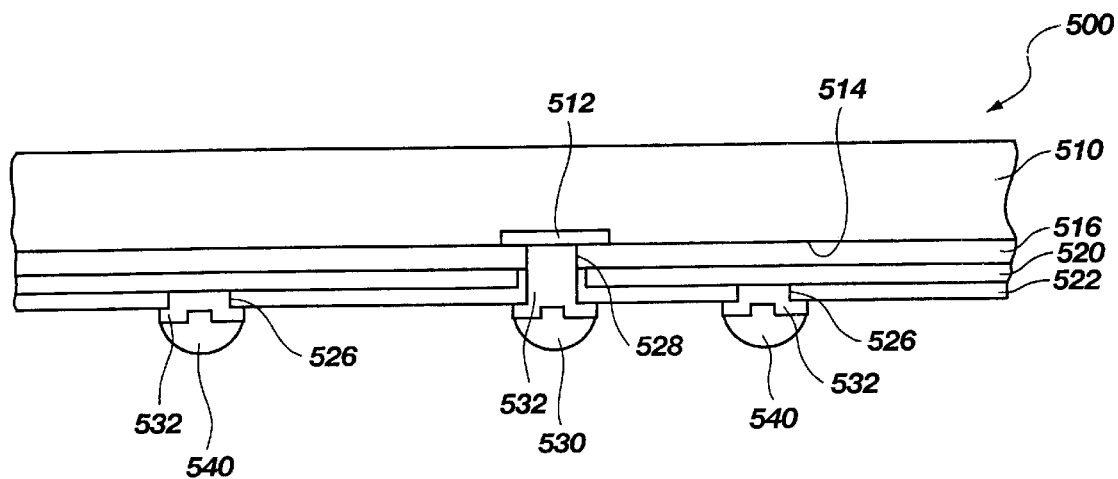
FIG. 11 is a cross-sectional view of a flip-chip semiconductor device according to a third embodiment of the present invention.

Illustrated in drawing FIG. 11 is a cross-sectional view of a portion of a flip-chip type semiconductor device 500 having ground bumps adjacent a center pad configuration according to a third embodiment of the present invention. The third embodiment of the present invention provides that the conductive bumps, such as the bumps on a ball grid array on the flip-chip type device, may be configured to have both ground bumps 540 and signal bumps 530 arranged so that the ground bumps 540, in addition to a ground plane 520, substantially prevent electromagnetic and electrostatic fields emanating from adjacent signal bumps 530 and adjacent metal interconnects 532 from coupling. Further, the ground bumps 540 provide direct access to the ground plane 520, rather than interconnecting through the semiconductor die 510 itself. The center bond pad configuration of the first embodiment provides signal bumps 530 connected to bond pads 512 aligned centrally on an active surface 514 of the semiconductor die 510 and ground bumps 540 aligned adjacently along at least one side and preferably along opposing sides of the signal bumps 530 and aligned parallel to the signal bumps 530, as shown in the active surface view of the flip-chip type semiconductor device 500 in FIG. 12.

As illustrated, the active surface 514 of the semiconductor die 510 includes bond pads 512 for interconnecting with the signal bumps 530. A first dielectric layer 516 is formed over the active surface 514. A ground plane 520 is then formed over the first dielectric layer 516 using any metal or alloy in any well-known manner, such as by sputtering or evaporation of aluminum or aluminum alloy. A second dielectric layer 522 is then formed over the ground plane 520. The first and second dielectric layers 516 and 522 may be deposited by low-pressure chemical vapor deposition or spin-on polymer passivation or any method known to those of ordinary skill in the art.

A photoresist is then formed and patterned over the second dielectric layer 522 to define openings 528 which are formed through each of the dielectric layers 522, 516, and ground plane 520 to expose the bond pads 512 on active surface 514 of semiconductor die 510. A protective oxide layer is then formed over the second dielectric layer 522 and openings 528, after which another photoresist is formed and patterned to define vias 526 which are formed through the second dielectric layer 522 to expose portions of the ground plane 520. Such openings 528 and vias 526 are formed using methods well known in the art, such as well-known photolithographic techniques and etching techniques. A metal interconnect layer or layers are then deposited over the protective oxide layer and patterned to form metal interconnects 532 in the openings 528 and vias 526. Such metal interconnects 532 may be formed using any well-known depositing and etching technique. Conductive bumps including the ground bumps 540 and signal bumps 530 are then provided on the metal interconnects 532 that lead to the respective ground plane 520 and the bond pads 512 on the semiconductor die 510.

Figure 12:
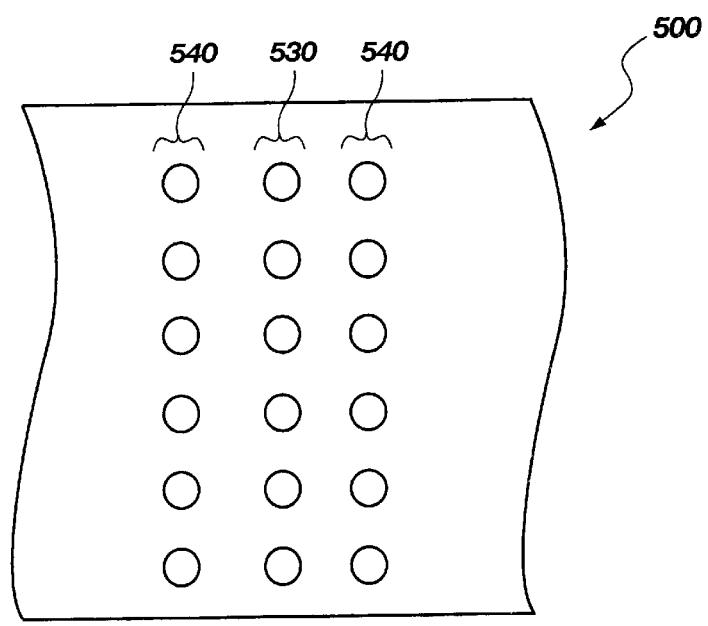
FIG. 12 is an active surface view of a flip-chip semiconductor device according to the third embodiment of the present invention.

Similar to the ground plane isolating the signal lines as set forth in previous embodiments, the ground bumps 540 are made to isolate and reduce coupling among adjacent signal bumps 530 to thereby reduce cross-talk therebetween. The distance between adjacent signal bumps 530, adjacent ground bumps 540, and ground bumps 540 adjacent to signal bumps 530 necessary for obtaining optimal reductions of cross-talk, and therefore optimal performance, may be readily determined by one of ordinary skill in the art. As such, FIG. 12 is a simplified representation of a possible arrangement of the ground bumps 540 and signal bumps 530, although other configurations may be employed as determined by one skilled in the art.

Figure 13:
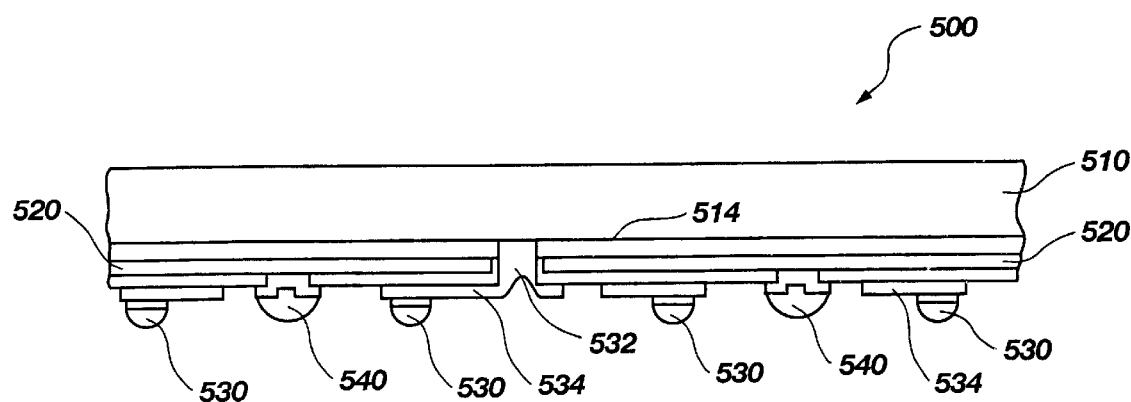
FIG. 13 is a cross-sectional view of a flip-chip semiconductor device according to a first alternative of the third embodiment of the present invention.
Figure 14:
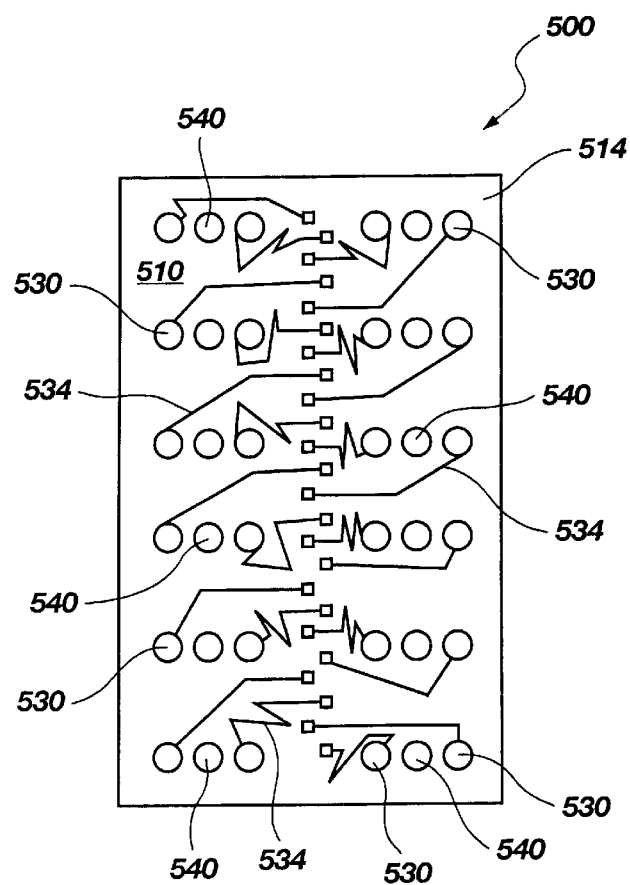
FIG. 14 is an active surface view of a flip-chip semiconductor device according to a first alternative of the third embodiment of the present invention.

Illustrated in drawing FIG. 13 is a cross-sectional view of a portion of a flip-chip type semiconductor device 500 of a first alternative of the third embodiment of the present invention. This alternative is similar to the first embodiment of the present invention in every respect, except the metal interconnect 532 extends to signal lines 534, and to respective signal bumps 530, to thereby provide a staggered center bond pad configuration as shown in the active surface 514 of the semiconductor die 510 of the flip-chip type semiconductor device 500 in FIG. 14. In particular, after depositing the metal interconnect layer, such layer is patterned to form the signal lines 534. As in the previous embodiments, it is important that the signal lines 534 have substantially equal lengths by adding bends and lengths to make each signal line 534 substantially as long as the longest signal line. Further, the ground plane 520 is disposed between the active surface 514 of the semiconductor die 510 and the signal lines 534 to therefore isolate the signal lines 534 from the circuitry on the active surface 514 of the semiconductor die 510. Thus, this particular alternative provides advantages based on the ground bumps 540 and the ground plane 520 in reducing coupling and cross-talk between adjacent signal lines 534 and adjacent signal bumps 530.

Figure 15A:
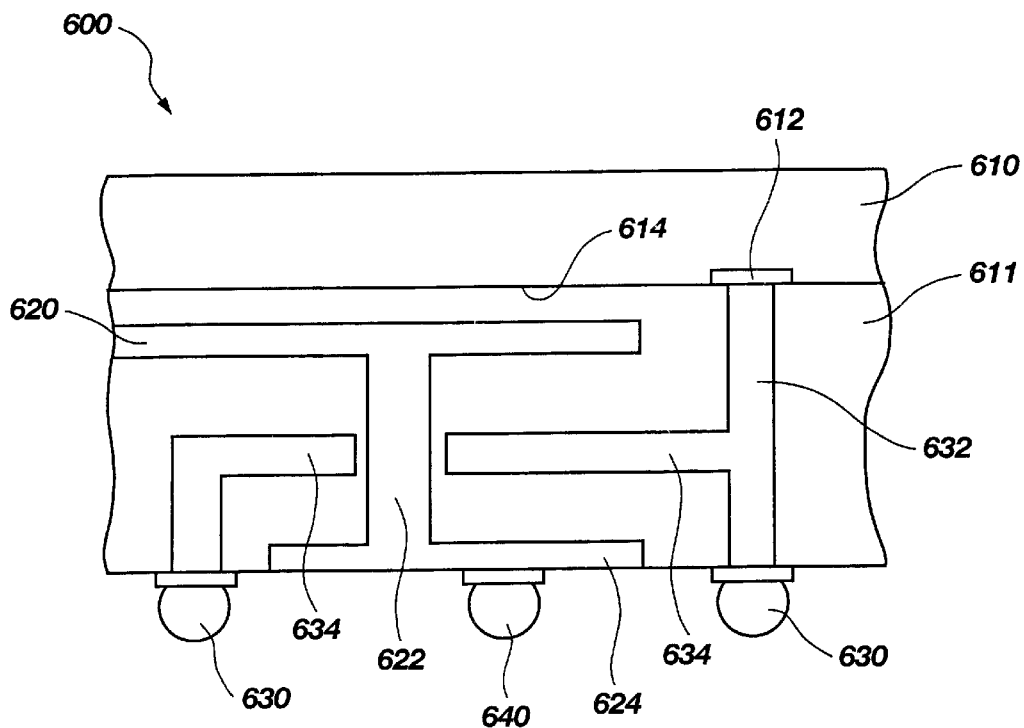
FIG. 15A is a cross-sectional view of a portion of a flip-chip semiconductor device according to a fourth embodiment of the present invention.
Figure 15B:
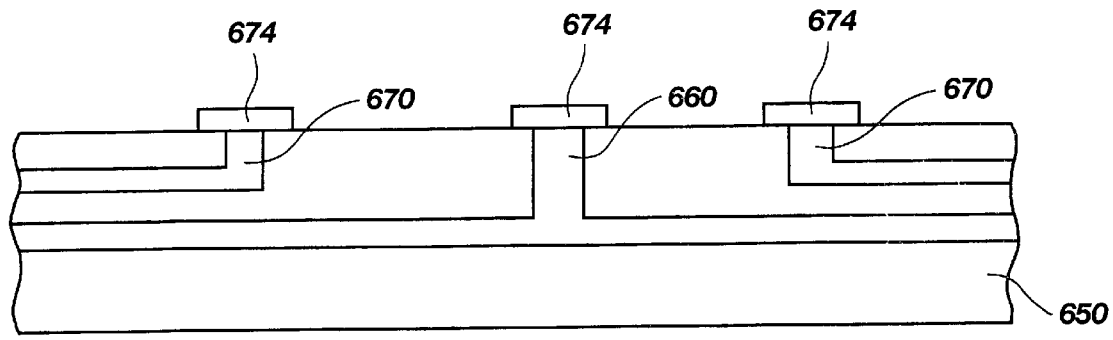
FIG. 15B is a cross-sectional view of a portion of a flip-chip semiconductor device according to the fourth embodiment of the present invention.

Illustrated in drawing FIG. 15A and FIG. 15B is a cross-sectional view of a flip-chip type semiconductor device 600 having at least two ground planes according to a fourth embodiment of the present invention. The fourth embodiment of the present invention is similar to the embodiment shown in FIG. 10, wherein there is a second ground plane 624 formed over the signal lines 634. However, in this fourth embodiment of the present invention, access to the ground plane 620 is through the ground bumps 640 rather than interconnecting through the semiconductor die 610. The ground bumps 640 are arranged adjacent the signal bumps 630 in the dielectric material 611, in which the ground bumps 640 effectively reduce the coupling and cross-talk between adjacent signal bumps 630. Further, with the second ground plane 624 interconnecting with the first ground plane 620 via ground interconnects 622, there is additional isolation between adjacent signal lines 632, 634 and the circuitry on the active surface 614 of the semiconductor die 610. The ground bumps 640 and the signal bumps 630 on the flip-chip type semiconductor device 600 are made to attach with corresponding bond pads 674 of another substrate 650, such as a printed circuit board, a carrier substrate or the active surface of another semiconductor die. Such substrate 650 includes substrate ground interconnects 660 and substrate signal interconnects 670 which are configured to correspond with respective ground bumps 640 and signal bumps 630. As before, it is important that the signal lines 632, 634 have substantially equal lengths by adding bends and lengths to make each signal line substantially as long as the longest signal line.

Figure 16:
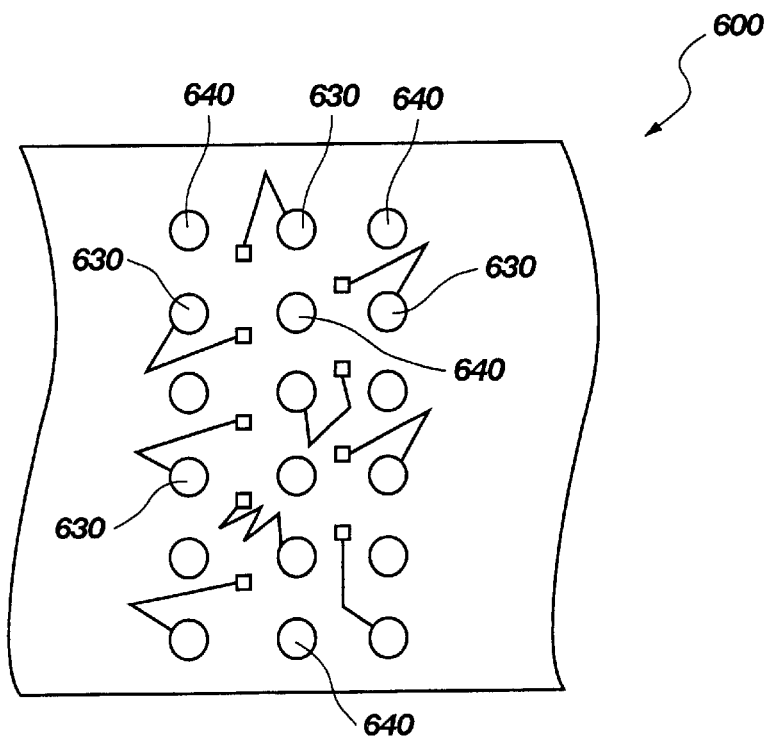
FIG. 16 is an active surface view of a flip-chip semiconductor device according to a first alternative of the fourth embodiment of the present invention.

The ground bump 640 and signal bump 630 arrangement may be provided in any number of patterns. For example, depicted in drawing FIG. 16 is an active surface view of a flip-chip type semiconductor device 600 of a first alternative of the fourth embodiment of the present invention, wherein the ground bumps 640 and signal bumps 630 are in a checkered pattern arrangement. Such arrangement provides advantages of isolating each signal bump 630 from adjacent signal bumps 630 with two to four ground bumps 640 adjacent thereto.

Figure 17:
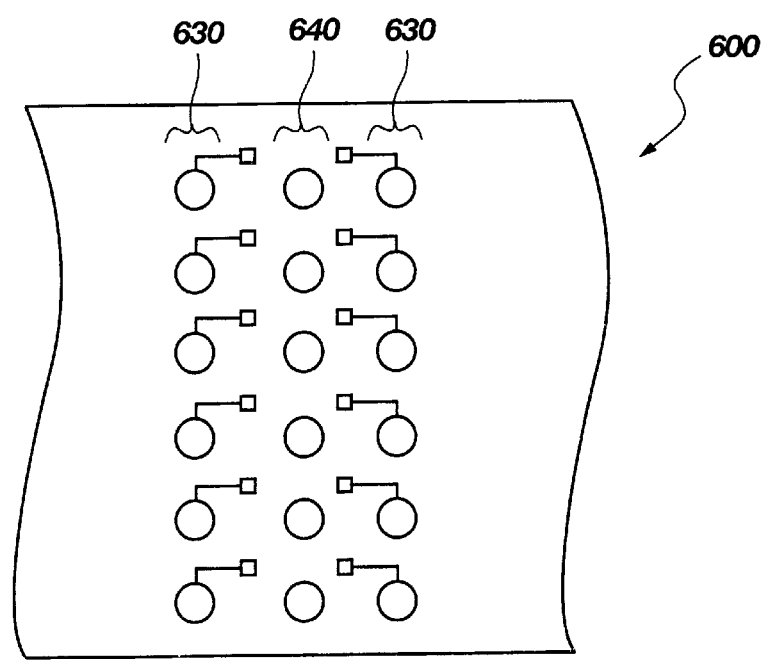
FIG. 17 is an active surface view of a flip-chip semiconductor device according to a second alternative of the fourth embodiment of the present invention.

Illustrated in drawing FIG. 17 is a second alternative of the fourth embodiment of the present invention, wherein another ground bump and signal bump arrangement is depicted where the ground bumps 640 are centrally located and aligned on the flip-chip type semiconductor device 600 and the signal bumps 630 are aligned parallel to the centrally aligned ground bumps 640 on opposing sides thereof.

Figure 18:
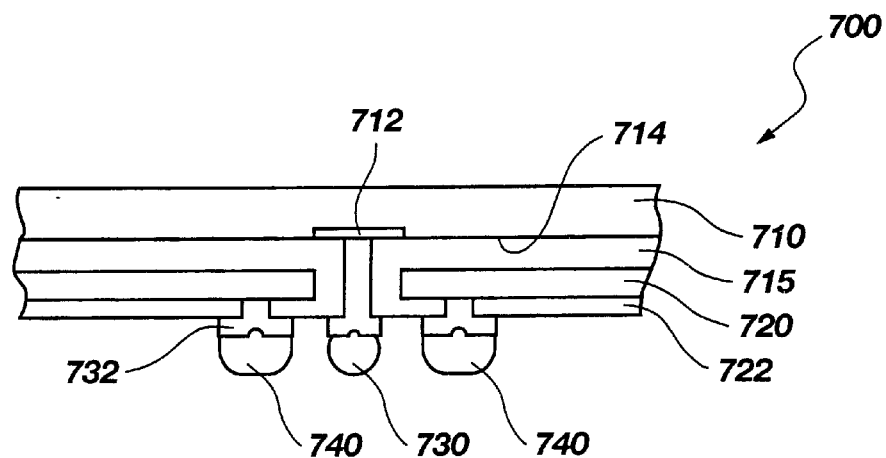
FIG. 18 is a cross-sectional view of a flip-chip semiconductor device according to a fifth embodiment of the present invention.

Illustrated in drawing FIG. 18 is a cross-sectional view of a flip-chip type semiconductor device 700 having opposing ground strips 740 according to a fifth embodiment of the present invention. The fifth embodiment is similar to the center bond pad configuration of the first embodiment, in which there is a semiconductor die 710 having an active surface 714 from which there are metal interconnects 732 and signal bumps 730 extending from centrally aligned bond pads 712 in the active surface 714 of the semiconductor die 710. A ground plane 720 is disposed between a first dielectric layer 715 and a second dielectric layer 722 over the active surface 714 of the semiconductor die 710. However, instead of ground bumps interconnecting with the ground plane 720, the fifth embodiment includes opposing ground strips 740 interconnecting with the ground plane 720.

Figure 19:
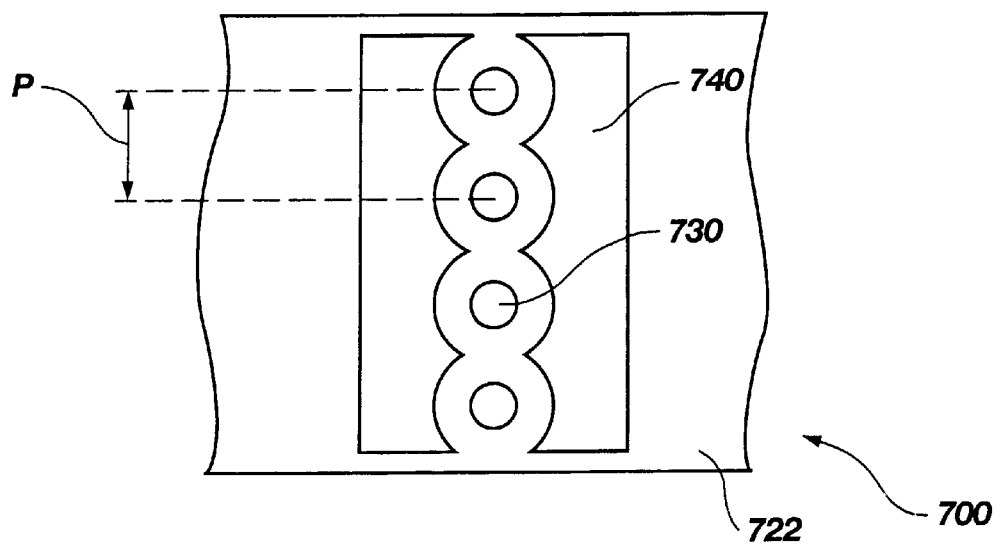
FIG. 19 is an active surface view of a flip-chip semiconductor device according to a fifth embodiment of the present invention.

As depicted in the view of the flip-chip type semiconductor device in FIG. 19, the ground strips 740 are on opposing sides of a centrally aligned row of signal bumps 730. More particularly, one ground strip 740 is provided on one side of the row of signal bumps 730 and a second ground strip 740 is provided on an opposing side of the row of signal bumps 730. The portions of the first and second ground strips 740 that are adjacent the row of signal bumps 730 are configured and partially shaped to follow a peripheral contour of the row of signal bumps 730. Such configuration of the opposing ground strips 740 allows for a tight pitch P between adjacent signal bumps 730 while preventing the coupling and cross-talk therebetween. As such, the number of signal bumps 730 may be optimized on the flip-chip type semiconductor device 700.

Figure 20:
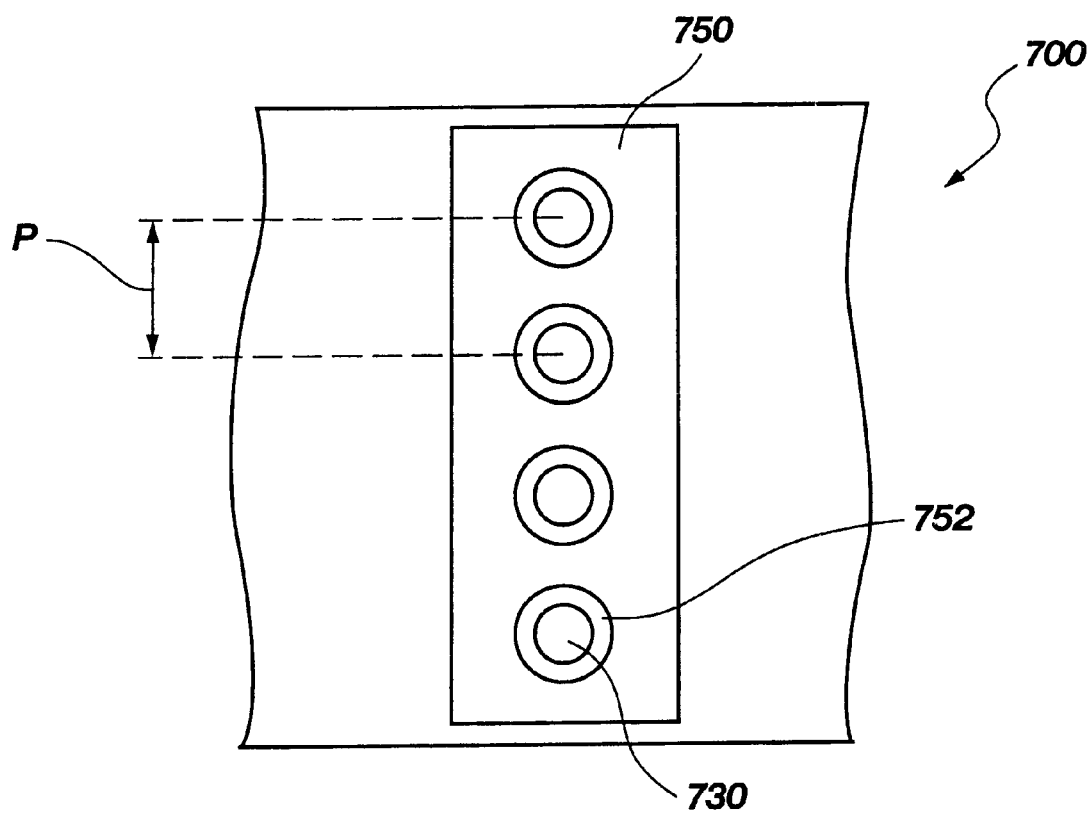
FIG. 20 is an active surface view of a flip-chip semiconductor device according to a fifth alternative of the fifth embodiment of the present invention.

Illustrated in drawing FIG. 20 is an active surface view of the flip-chip semiconductor device of a first alternative of the fifth embodiment of the present invention. In this first alternative, instead of having opposing ground strips, there is a single ground strip 750 for any given row of signal bumps 730. The signal bumps 730 may include a patterned passivation layer 752 formed thereon so that the metal layer deposited and patterned to form the single ground strip 750 is spaced from the signal bumps 730 to prevent shorting between the single ground strip 750 and the signal bumps 730. Since the ground strip 750 in this alternative completely surrounds each signal bump 730 in the row of signal bumps 730, the signal bumps 730 are completely isolated from coupling and cross-talk between each other. In comparison with the previous embodiment, the pitch P between adjacent signal bumps 730 in this alternative is somewhat looser or wider since there needs to be a gap between the signal bump 730 and ground strip 750 to prevent shorting.

Figure 21:
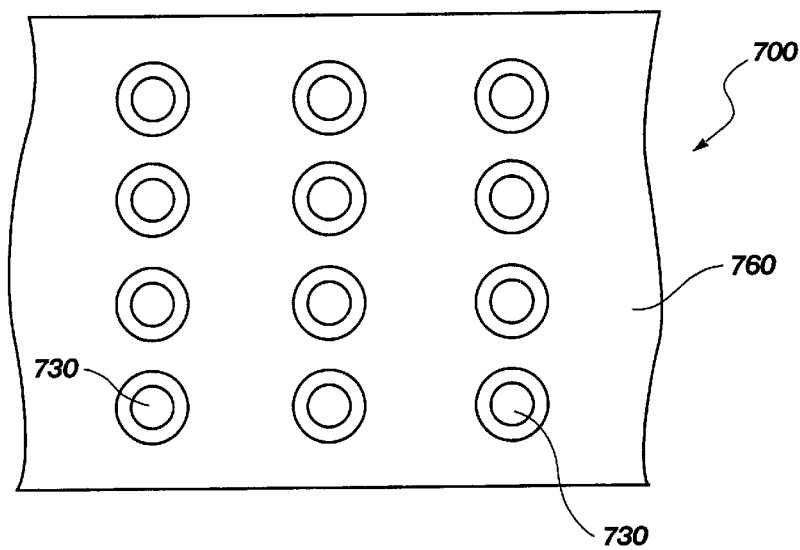
FIG. 21 is an active surface view of a flip-chip semiconductor device according to a second alternative of the fifth embodiment of the present invention.
Figure 22:
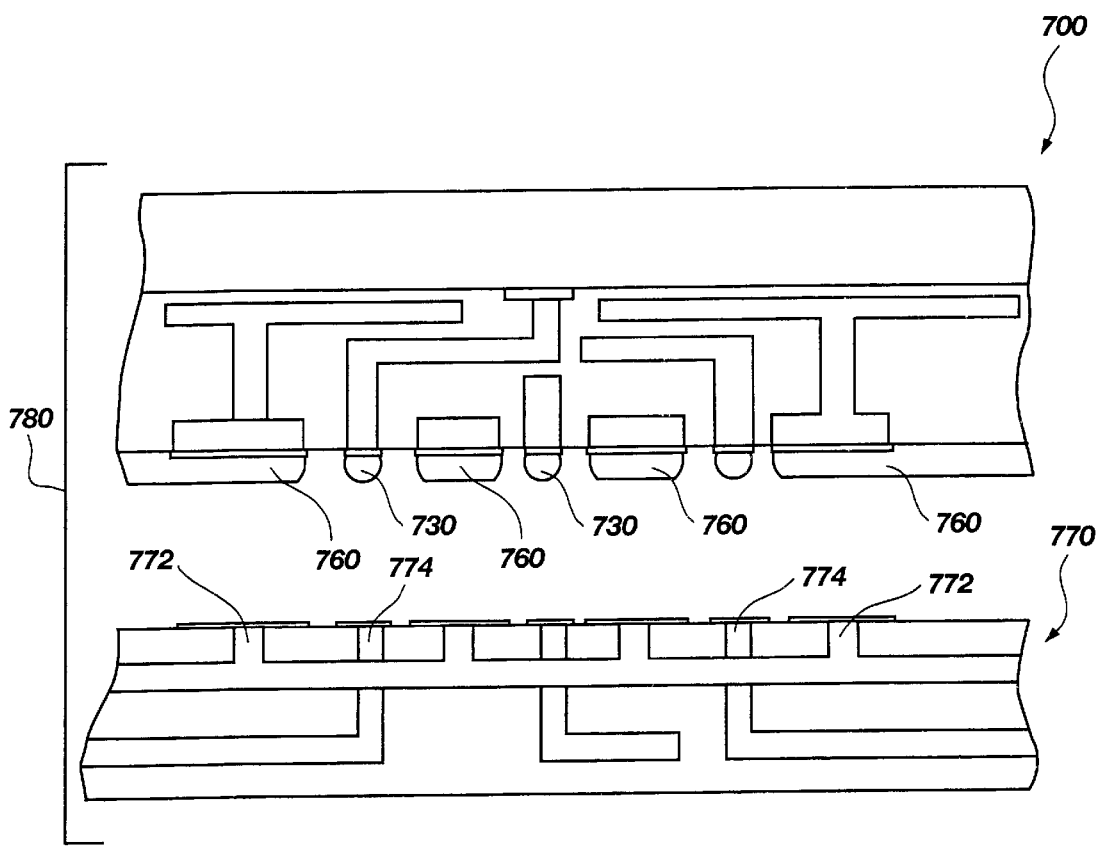
FIG. 22 is a cross-sectional view of a flip-chip semiconductor device according to a second alternative of the fifth embodiment of the present invention.

Illustrated in drawing FIG. 21 is an active surface view of the flip-chip type semiconductor device 700 according to a second alternative to the fifth embodiment of the present invention. The second alternative is similar to the previously discussed first alternative, except the single ground strip is a bump ground plane 760 disposed around each of the signal bumps 730 extending from the active surface of the flip-chip type semiconductor device 700. As in the previous alternative, there is a gap around each of the signal bumps 730 to prevent shorting between the bump ground plane 760 and the signal bumps 730. As shown in FIG. 22, the bump ground plane 760 and signal bumps 730 are made to interconnect with corresponding ground connections 772 and signal connections 774 in a carrier substrate 770 to provide a flip-chip type semiconductor assembly 780.

With any of these embodiments, it may also be desirable to place a dielectric or passivation layer on the upper surface of the flip-chip type semiconductor device, leaving the conductive elements exposed, to protect the upper conductive layer from coming in contact with other conductive signal lines, grounding to another component, or contacting solder overflow from the flip-chip bonding process. It is also contemplated and will be understood by one of ordinary skill in the art that while only a single electrical interconnect layer has been shown and described with respect to each of the embodiments herein, two or more electrical interconnect layers may be formed, each separated from other conductive layers by a dielectric layer or two dielectric layers and a ground plane using similar methods well known in the art.

It is contemplated, and will be clear to one of ordinary skill in the art, that the principles of the present invention are applicable to semiconductor architectures and fabrication techniques relating to other flip-chip type forms, and those other than flip-chip type semiconductor architectures and fabrication techniques. For example, the present invention may also reduce signal skew and eliminate the need for capacitive and inductive compensation for controlled collapse chip connections (C4s), chip scale packaging (CSP), lead frame bonded architectures and tape automated bonding (TAB) architectures. It will also be clear to one of ordinary skill in the art that, though the embodiments shown are directed to particular shapes and dimensions of chip packaging, the principles of the present invention may be readily adapted for use with any size or shape semiconductor package, including, without limitation, square and rectangularly shaped semiconductor dice, and any configuration of bond pads or conductive elements whether distributed uniformly across the die, gathered in selected regions of the die, arranged around the periphery of the die or arranged along the center of the die. It is believed that one of ordinary skill in the art may readily adapt the principles taught herein to other existing semiconductor architectures.

Figure 23:
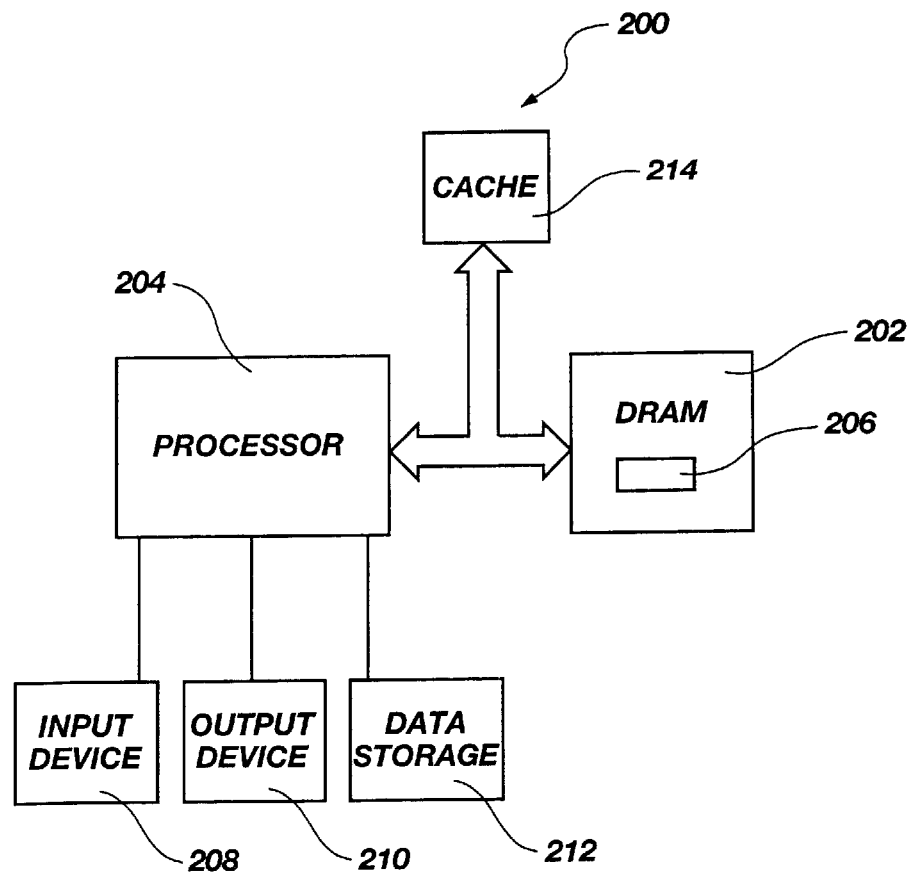
FIG. 23 is a block diagram of an electrical system comprising a flip-chip semiconductor device according to any embodiment of the present invention.

Illustrated in drawing FIG. 23 is a block diagram of an electronic system 200 which includes components having one or more flip-chip type semiconductor devices 206 having signal lines of substantially equal lengths and configured according to one or more embodiments, any embodiment, of the present invention. The electronic system 200 includes a processor 204 for performing various computing functions, such as executing specific software to perform specific calculations or tasks. Additionally, the electronic system 200 includes one or more input devices 208, such as a keyboard or a mouse, coupled to the processor 204 to allow an operator to interface with the electronic system 200. The electronic system 200 also includes one or more output devices 210 coupled to the processor 204, such output devices including such outputs as a printer, a video terminal or a network connection. One or more data storage devices 212 are also conventionally coupled to the processor 204 to store or retrieve data from external storage media (not shown). Conventional storage devices 212 include, but are not limited to, hard and floppy disks, tape cassettes, and compact disks. The processor 204 is also conventionally coupled to a cache memory 214, which is usually static random access memory ("SRAM"), and to DRAM 202. It will be understood, however, that the flip-chip type semiconductor device 206 configured according to one or more of the embodiments of the present invention may be incorporated into any one of the cache, DRAM, input, output, storage and processor devices 214, 202, 208, 210, 212, and 204.

Figure 24:
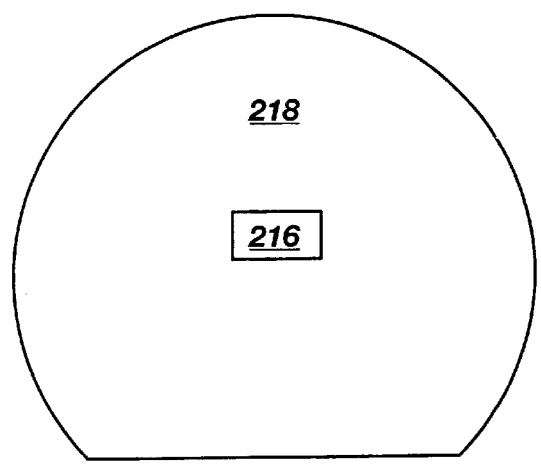
FIG. 24 is a diagram of semiconductor wafer comprising a flip-chip semiconductor device according to any embodiment of the present invention.

As illustrated in drawing FIG. 24, flip-chip semiconductor dice 216 may be fabricated on the surface of a semiconductor wafer 218 of silicon, gallium arsenide, or indium phosphide in accordance with one or more embodiments of the present invention. One of ordinary skill in the art will understand how to adapt such designs for a specific die architecture or semiconductor fabrication process. Of course, it should be understood that signal lines and, optionally, ground planes in accordance with the present invention may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claims is:

1. A semiconductor device comprising:
    a semiconductor substrate having an active surface;
    at least one ground plane on said semiconductor substrate disposed over at least a portion of said active surface;
    a dielectric layer having a portion disposed between said at least one ground plane and said active surface and having a portion disposed over said at least one ground plane, said dielectric layer having a plurality of signal vias therein extending through said at least one ground plane to said active surface and at least one ground via therein exposing said at least one ground plane; and
    conductive interconnections formed in said plurality of signal vias and said at least one ground via, said conductive interconnections comprising a plurality of signal interconnections and at least one ground interconnection, said at least one ground interconnection arranged adjacent said signal interconnections.

2. The semiconductor device of claim 1, wherein said at least one ground interconnection is configured to couple electromagnetic fields from the signal interconnections.

3. The semiconductor device of claim 1, wherein said at least one ground interconnection is configured to prevent coupling between adjacent signal interconnections.

4. The semiconductor device of claim 1, wherein said plurality of signal interconnections comprises a centrally aligned configuration on said semiconductor substrate.

5. The semiconductor device of claim 1, wherein said at least one ground interconnection comprises a plurality of ground bumps configured to provide connection with said at least one ground plane.

6. The semiconductor device of claim 4, wherein said at least one ground interconnection comprises a plurality of ground bumps adjacently aligned alongside of said centrally aligned configuration of said plurality of signal interconnections.

7. The semiconductor device of claim 1, wherein said plurality of signal interconnections comprises signal lines and signal bumps.

8. The semiconductor device of claim 7, wherein said signal lines each comprise a length that is substantially equal to a length of at least one other signal line.

9. The semiconductor device of claim 7, wherein said at least one ground interconnection comprises a plurality of ground bumps, each positioned and configured to couple electromagnetic fields from said signal bumps.

10. The semiconductor device of claim 7, further comprising a second ground plane overlying said signal lines.

11. The semiconductor device of claim 10, wherein said at least one ground interconnection is configured to provide connection with said second ground plane.

12. The semiconductor device of claim 10, wherein said at least one ground interconnection comprises a plurality of ground bumps extending from said second ground plane.

13. The semiconductor device of claim 10, wherein said second ground plane comprises a plurality of ground bumps, said ground bumps and said signal bumps having a checkered configuration.

14. The semiconductor device of claim 10, wherein said second ground plane comprises a plurality of ground bumps, said ground bumps having a centrally aligned configuration.

15. The semiconductor device of claim 14, wherein said signal bumps are aligned substantially parallel to and on opposing sides of said ground bumps in said centrally aligned configuration.

16. The semiconductor device of claim 1, wherein said at least one ground interconnection comprises at least one ground strip.

17. The semiconductor device of claim 1, wherein said at least one ground interconnection comprises a ground plane having vias therein.

18. The semiconductor device of claim 1, wherein said at least one ground interconnection comprises at least one ground strip disposed substantially, adjacently planar with said plurality of signal interconnections.

19. A semiconductor device comprising:
    a semiconductor substrate having an active surface;
    a dielectric material on said semiconductor substrate and extending over said active surface, said dielectric material having a plurality of vias formed therein;
    signal interconnects formed at least partially in one or more of said plurality of vias for electrical interconnection with said active surface; and at least one ground plane disposed in said dielectric material having at least one ground interconnect extending therefrom, said at least one ground interconnect formed at least partially in at least one of said plurality of vias formed in said dielectric material, said at least one ground interconnect arranged adjacent at least one of said signal interconnects.

20. The semiconductor device of claim 19, wherein said at least one ground interconnect is configured to couple electromagnetic fields from said signal interconnects.

21. The semiconductor device of claim 19, wherein said at least one ground interconnect is configured to prevent coupling between adjacent signal interconnects.

22. The semiconductor device of claim 19, wherein said signal interconnects comprise signal lines and signal bumps.

23. The semiconductor device of claim 22, wherein said signal lines each comprise a length that is substantially equal to a length of at least one other signal line.

24. The semiconductor device of claim 22, wherein said at least one ground interconnect comprises a plurality of ground bumps, each positioned and configured to couple electromagnetic fields from said signal bumps.

25. The semiconductor device of claim 22, further comprising a second ground plane overlying said signal lines to substantially eliminate coupling between said signal interconnects.

26. The semiconductor device of claim 25, wherein said at least one ground interconnect is configured to provide connection with said second ground plane.

27. The semiconductor device of claim 25, wherein said second ground plane comprises a plurality of ground bumps extending therefrom.

28. The semiconductor device of claim 19, wherein said at least one ground interconnect comprises at least one ground strip disposed substantially adjacent to and planar with said signal interconnects.

29. The semiconductor device of claim 19, wherein said at least one ground interconnect comprises a plurality of ground bumps disposed substantially adjacent to and planar with said signal interconnects.

30. A semiconductor assembly comprising:
a carrier substrate having conductive pads thereon;
a semiconductor substrate having an active surface;
at least one ground plane on said semiconductor substrate disposed over at least a portion of said active surface thereof;
a dielectric layer having a portion disposed between said at least one ground plane and said active surface and having a portion over said at least one ground plane, said dielectric layer having a plurality of signal vias therein extending through said at least one ground plane to said active surface and at least one ground via therein extending to said at least one ground plane; and
conductive interconnects formed at least partially in said plurality of signal vias and said at least one ground via, said conductive interconnects interconnecting with said conductive pads on said carrier substrate, said conductive interconnects comprising signal interconnects and at least one ground interconnect, said at least one ground interconnect arranged adjacent at least one of said signal interconnects.

31. The semiconductor assembly of claim 30, wherein said at least one ground interconnect is configured to couple electromagnetic fields from said signal interconnects.

32. The semiconductor assembly of claim 30, wherein said at least one ground interconnect is configured to prevent coupling between adjacent signal interconnects.

33. The semiconductor assembly of claim 30, wherein said signal interconnects comprise signal lines and signal bumps.

34. The semiconductor assembly of claim 30, wherein said signal interconnects comprise signal lines.

35. The semiconductor assembly of claim 34, wherein said signal lines each comprise a length that is substantially equal to a length of at least one other signal line.

36. The semiconductor assembly of claim 33, wherein said at least one ground interconnect comprises a plurality of ground bumps, each positioned and configured to couple electromagnetic fields from said signal bumps.

37. The semiconductor assembly of claim 33, further comprising a second ground plane overlying said signal lines to substantially eliminate coupling between said signal interconnects.

38. The semiconductor assembly of claim 37, wherein said second ground plane interconnects with said at least one ground plane.

39. The semiconductor assembly of claim 37, wherein said second ground plane comprises a plurality of ground bumps extending therefrom.

40. The semiconductor assembly of claim 37, wherein said second ground plane comprises at least one ground strip disposed substantially adjacent to and planar with said signal bumps.

41. The semiconductor assembly of claim 37, wherein said at least one ground interconnect comprises at least one ground strip disposed substantially adjacent to and planar with said signal interconnects.

42. The semiconductor assembly of claim 30, wherein said at least one ground interconnect comprises a plurality of ground bumps disposed substantially adjacent to and planar with said signal interconnects.

43. An electronic system comprising:
a processor;
a memory device associated with said processor;
at least one of an input device, an output device and a data storage device associated with said processor; and
at least one component of said electronic system comprising a semiconductor device including:
a semiconductor substrate having an active surface;
a dielectric material on said semiconductor substrate overlying at least a portion of said active surface, said dielectric material having a plurality of vias formed therein;
signal interconnections formed at least partially in one or more of said plurality of vias for electrical interconnection with said active surface; and
at least one ground plane disposed in said dielectric material having at least one ground interconnect extending therefrom, said at least one ground interconnect formed at least partially in at least one of said plurality of vias formed in said dielectric material, said at least one ground interconnect having a portion arranged adjacent said signal interconnections to prevent coupling between adjacent signal interconnections.

* * * * *

UNITED STATES PATENT AND TRADEMARK OFFICE
CERTIFICATE OF CORRECTION

PATENT NO. : 6,627,999 B2
DATED : September 30, 2003
INVENTOR(S) : Salman Akram and John O. Jacobson It is certified that error appears in the above-identified patent and that said Letters Patent is hereby corrected as shown below:

Column 2,
Line 59, before "are" change "panes" to -- planes --.
Line 62, change ""cross-talk"," to -- "cross-talk," --.

Column 5,
Line 7, change "alternate" to -- alternative --.
Line 57, before "alternative" change "fifth" to -- first --.
Line 63, before "second" change "a" to -- the --.

Column 14,
Line 2, after "said" and before "signal" insert -- plurality of --.
Line 5, after "the" and before "signal" insert -- plurality of --.
Line 8, after "interconnections" and before the period insert -- of the plurality of signal interconnections --.

Signed and Sealed this

Twenty-fourth Day of January, 2006

JON W. DUDAS
*Director of the United States Patent and Trademark Office*